United States Patent
Fagerness

[19]

[11] Patent Number: 5,831,988
[45] Date of Patent: Nov. 3, 1998

[54] FAULT ISOLATING TO A BLOCK OF ROM

[75] Inventor: Gerald G. Fagerness, Mazeppa, Minn.

[73] Assignee: Unisys Corporation, Blue Bell, Pa.

[21] Appl. No.: 788,111

[22] Filed: Jan. 23, 1997

[51] Int. Cl.⁶ .................................................. G11C 29/00
[52] U.S. Cl. ...................... 371/21.2; 371/21.1; 371/25.1; 371/67.1
[58] Field of Search .................................. 371/21.1, 21.2, 371/22.4, 22.5, 22.6, 25.1, 67.1; 395/183.18; 365/201; 324/158.1

[56] References Cited

U.S. PATENT DOCUMENTS

| | | | |
|---|---|---|---|
| 4,872,168 | 10/1989 | Aadsch et al. ........................... | 371/22.4 |
| 5,051,996 | 9/1991 | Bergeson et al. ....................... | 371/22.4 |
| 5,293,386 | 3/1994 | Muhmenthaler et al. .............. | 371/21.1 |
| 5,299,202 | 3/1994 | Vaillancourt ........................... | 371/21.1 |
| 5,301,199 | 4/1994 | Ikenaga et al. ......................... | 371/22.4 |
| 5,303,192 | 4/1994 | Baba ....................................... | 371/21.1 |
| 5,355,342 | 10/1994 | Ueoka ..................................... | 371/21.1 |
| 5,388,104 | 2/1995 | Shisotori et al. ....................... | 371/21.1 |

*Primary Examiner*—Hoa T. Nguyen
*Attorney, Agent, or Firm*—Nawrocki, Rooney & Silvertson, P.A.

[57] ABSTRACT

Apparatus for fault isolating errors in memory elements. A test "Signature" word is obtained by successively manipulating all of the words in a memory block. A first embodiment uses serial processing and a second embodiment uses parallel processing. In either process, prior to test, a derived signature is provided, which is the same as the resulting test signature for each block if no error is detected, and which are stored in test order prior to testing. In either embodiment, after each test signature word is obtained from a block of data, the test signature word is compared bit for bit with the corresponding derived Signature word, and if the two are not identical, an error is indicated. Any block addresses which contain errors are marked in a Fault Address RAM which can be read by external equipment to avoid the use of the faulty blocks.

15 Claims, 4 Drawing Sheets

FAULT ISOLATING TO A BLOCK OF ROM

CROSS-REFERENCE TO A RELATED APPLICATION

This application is related to U.S. patent application Ser. No. 08/636,759, filed Apr. 19, 1996, entitled "Combined ROM and RAM Control Store Apparatus", and U.S. patent application Ser. No. 08/788,109, filed Jan. 23, 1997, entitled "Array Self-Test Fault Tolerant Programmable Threshold Algorithm", assigned to the same assignee as the present application and incorporated herein by reference.

BACKGROUND OF THE INVENTION

1. Field of the Invention

This invention relates to testing memory on integrated circuits and, more particularly, relates to testing and isolating memory faults to specific memory blocks.

2. Description of the Prior Art

In the production of application-specific integrated circuits (ASICs), manufacturing defects can cause a percentage of the die each wafer to be non-functional or otherwise fail to meet the desired specification. The percentage of die on a wafer that meet the desired specification divided by the total number of die on the wafer is known as die yield. The practice in the industry is to test each die and discard any die that have even one defect, or otherwise fail to meet the desired specification. Demanding such perfection substantially reduces the die yield that can be achieved, and increases the production costs of the usable die. Typically, the die yield must be twenty to thirty percent for the production of an ASIC design to be commercially feasible.

It is known that die yield decreases as the dimensions of the die increase. This is because there a greater chance that a defect will occur on each die. Further, it is known that a defect has a greater chance of affecting the operation of a die as the logic density increases. Modern integrated circuits are typically growing in overall dimension and density.

The most dense logic elements on a die typically are the memory elements. In particular, ROM elements typically are the most dense elements on an integrated circuit die. Thus, die containing a large number of storage devices such as ROMs may have substantially lower die yields. Typically, a ROM has either one or two transistors per memory cell, and the memory cells are layed out at the minimum allowed dimensions. Further, the metalization used to interconnect the memory cells is typically layed out at minimum width and spacing dimensions, and covers a substantial portion of the ROM array. It has been found that the ROM devices on modern ASIC may substantially and adversely affect the die yields of the ASIC.

In order to obtain acceptable die yields for high density ASIC having a large quantity of memory, it would be desirable to provide an arrangement where die with one or more defect within the memory arrays could be used despite the defect, thereby effectively increasing the die yield, and reducing the effective cost of each ASIC.

SUMMARY OF THE INVENTION

According to the present invention, fault-isolation apparatus is provided that conducts selected tests for ROM faults; determines the address block which contains the faults, if any; and records the fault block addresses so that the faulty blocks can be avoided. In an exemplary embodiment, each ROM is divided into a number of memory blocks. Each memory blocks includes a number of words. The present invention manipulates all words in a block of memory, and produces a unique test "signature" therefor. This signature is compared to a precalculated expected signature to determine if any faults are detected in the selected memory block. If a fault is detected, the address of the faulty block is recorded. Each of the memory blocks may be tested in this manner to identify each memory block that has a defect therein.

In a first illustrative embodiment, each word within a block of memory is sequentially read from the memory and placed in a shift register (SR). A signature shift register (SSR) is also provided, which initially stores a predetermined initial value. The serial output of the shift register (SR) and the serial output of the signature shift register (SSR) are provided to an XOR gate, with the output of the XOR gate being coupled to the serial input of the signature shift register (SSR).

In this configuration, and after a first word of data is read from the memory and placed in the shift register (SR), the first word of data and the initial value stored in the signature shift register (SSR) are consecutively bit shifted, and provided to the XOR gate. Thus, each bit of the initial value is XOR'd with the corresponding bit of the first word of data, with the result being shifted into the signature shift register. This is repeated for each bit of the first word of data.

Thereafter, a second word of data from the same block of memory is read and placed in the shift register (SR). Then, the second word of data and the resulting value in the signature shift register provided above, are consecutively bit shifted, and provided to the XOR gate. As described above, the result is shifted into the signature shift register providing a replacement signature. This is repeated for each word in the selected block of memory, using the replacement signature stored in the serial shift register from the previous word as the initial value. After all of the words in the selected block of memory are processed, a resulting final test signature resides in the signature shift register.

Although the diagrams herein only show a single XOR gate feeding the signature shift register which provides a parity value, a preferred embodiment includes a signature register which satisfies a primitive polynomial equation to prevent aliasing, as is known in the art.

In a second illustrative embodiment, the test signature is generated by using a parallel process rather than a serial process. Here, each word from the memory under test is loaded into a word register. Further, an initial value is loaded into a signature register. All bits in the two registers are added simultaneously by as many XOR circuits as there are bits in a word. The result is loaded back into the Signature register. This process is repeated as many times as there are words in a block of memory. The result is again a unique test signature representing the block of memory. The remainder of the process, as described below, is essentially identical for both the first and the second embodiments.

An expected signature is precalculated for every data block to be tested. In a preferred embodiment, these expected signatures are prestored in a signature RAM in the same order as the blocks of ROM are tested.

The test signatures obtained for each data block by actual testing. as described above, are compared with the precalculated expected signature. If the test signature and expected signature do not compare bit by bit, an error is detected in the corresponding block of memory. The address for any data block which contains an error is stored, preferably in a Fault Address register, which can be read by external apparatus. Thus, during operation of the ASIC, the faulty blocks of memory may be identified and avoided, thereby allowing ASICs having one or more defects therein to be used within a system.

BRIEF DESCRIPTION OF THE DRAWINGS

The objects of the present invention and its operation will be better understood by reference to the detailed description and the drawings in which like numbers refer to like elements and where.

DESCRIPTION OF PREFERRED EMBODIMENTS

Figure 1:
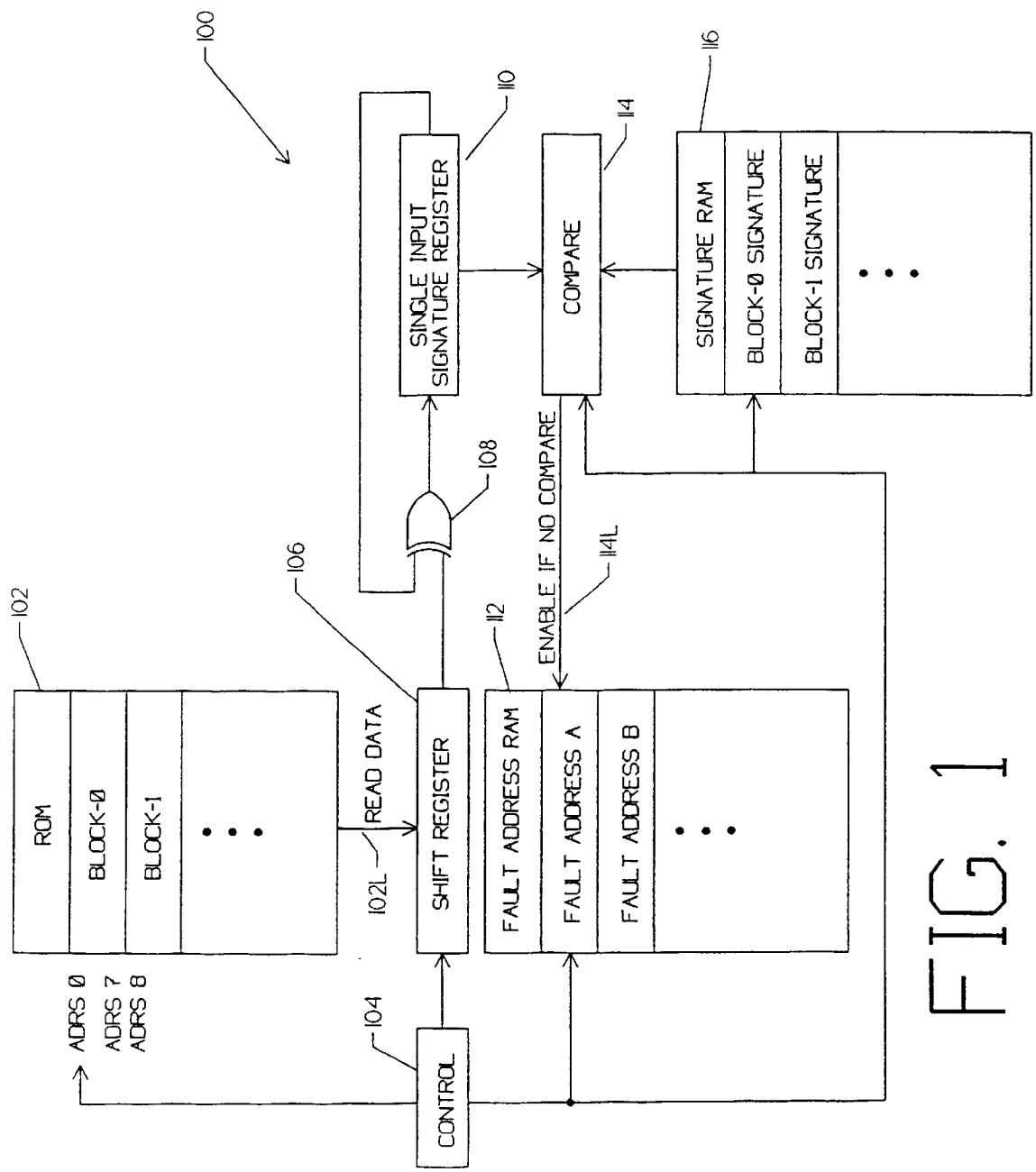
FIG. 1 is a block diagram of the first embodiment.

FIG. 1 shows a first embodiment of Fault Isolation Apparatus 100 which includes Control 104, Shift Register 106, Exclusive-OR Gate (XOR) 108, Single Input Signature Register (SISR) 110, Fault Address RAM 112, Compare 114, Signature RAM 116 and also shows ROM 102. ROM 102, the memory under test, is divided into a number of blocks. In this illustrative example, ROM 102 contains 256 blocks of words, with each block containing 8 words each 240 bits in length. All of the registers and memories are also 240 bits in length.

Control 104 contains a program which provides the ROM fault test operation to be described. SISR 110, the single input shift register, receives a most significant bit on the left and simultaneously shifts out the least significant bit to the right. XOR 108 provides a non-carry addition of its two inputs. Although the diagrams herein only show a single XOR gate feeding the signature shift register which provides a parity value, a preferred embodiment includes a signature register which satisfies a primitive polynomial equation to prevent aliasing, as is known in the art.

In operation, Control 104 calls up words sequentially from ROM 102 from Address 0 through Address 8 for Blocks 0 through 256, and sequentially loads each word from each block into Shift Register 106 in sequence.

The address of the block under test is also stored in Fault Address RAM 112, which is overwritten by the next block address tested unless the "Enable If Unequal" line 114L is high. If line 114L is high that address is saved and the next ROM 102 address is placed in an adjacent higher RAM 112 address. The cause of line 114 going high will be described later.

Control 104 also initially loads SISR 110 at the beginning of each block test. Typically this word is all zeros or all ones however any known pattern will suffice. In this example it is assumed that SISR 110 is loaded with all zeros. Prior to each block test run, Signature RAM 116 is loaded with a precalculated derived "Signature" words for each data block to be tested in the order of the block tests. The source of the precalculated Signatures and their significance will be described later.

After SISR 110 is loaded, here with all zeros, the first word of the block under test is sent to ROM 102 to read and load that data word and that block address also sent to RAM 112. The first data word from ROM 102 is then loaded into Shift Register 106 over lines 102L.

The address of the block under test is also stored in Fault Address Ram 112, which is overwritten by the next block address tested unless the "Enable If Unequal" line 114L is high. If line 114L is high that address is saved and the next ROM 102 address is placed in an adjacent higher RAM 112 address. The cause of line 114 going high will be described later. The address sequence of Fault Address RAM 112 begins with the Address A location.

The least significant bits of Shift Register 106 and SISR 110 are then shifted out and sent to XOR 108 where they are added and the results are shifted into SISR 110. This is repeated 240 times until all of the bits of the word loaded into Shift Register 106 from ROM 102 have been shifted out. Subsequent words from the data block under test of ROM 102 are then loaded in sequence into Shift Register 106 and shifted out in the same manner until all the bits of all eight words of the data block have been processed. After all eight words have been processed, a unique 240 bit Signature word in the SISR 110 register will represent that particular eight data word block and the initial SISR contents.

Figure 2:
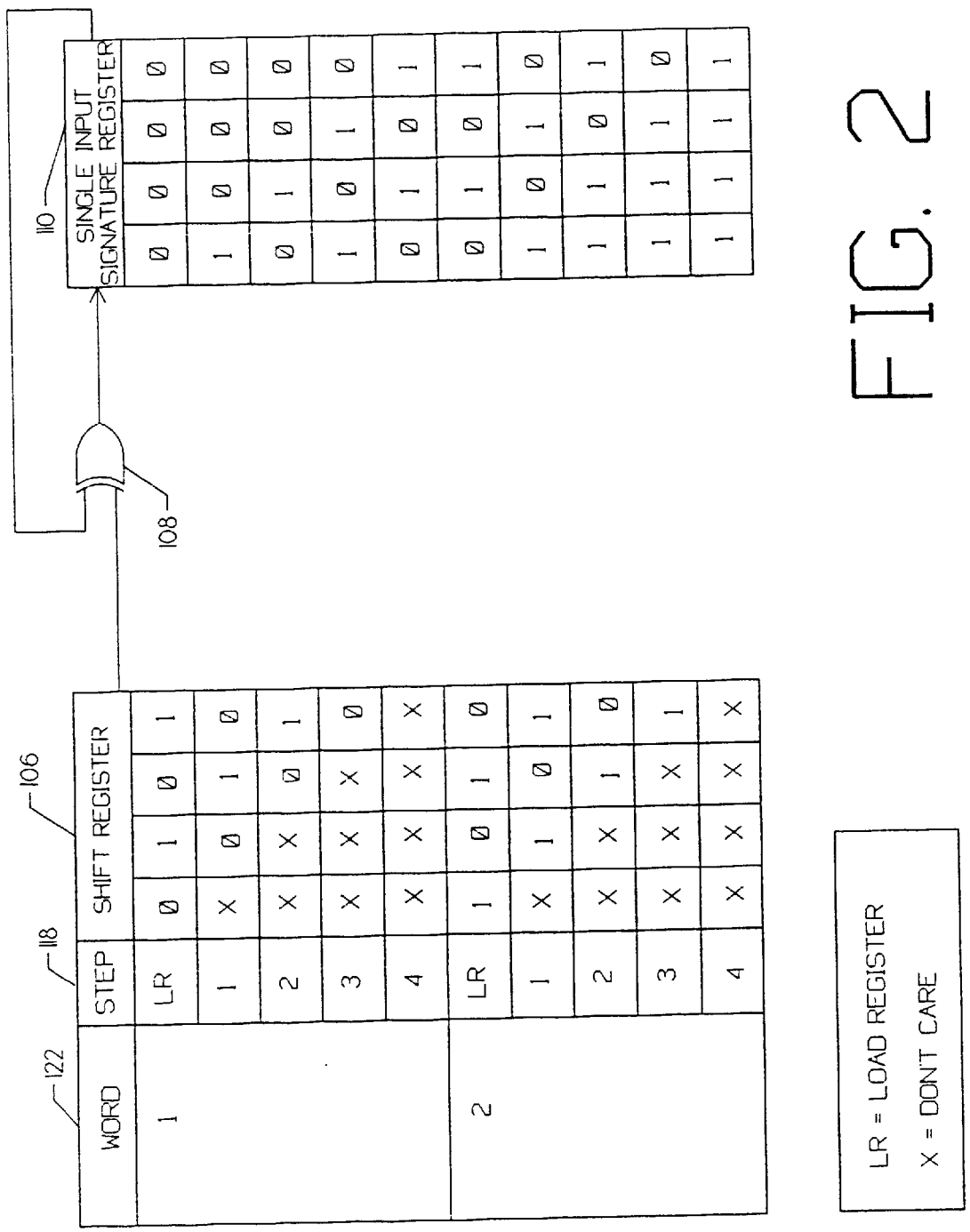
FIG. 2 is a simplified version of a portion of the first embodiment incorporating a table showing the results of operating that portion of the first embodiment.

A simplified version of this process and result using only four bit words and a two word block is shown in FIG. 2. Here only XOR 108, Shift Register 106 and SISR 110 have been are directly involved. Step 118 column lists the steps of the process with time progressing downward. Word 122 column indicates which word is being operated upon. Opposite each Step 118 are shown the corresponding four bit contents respectively located below Shift Register 106 and SISR 110.

The process begins with step Load Registers (LR) where Word 1, 0101, the first ROM word, is loaded into Shift Register 106 and 0000 is loaded into SISR 110. Step 1 of Word 1 results when both Shift Register 106 and SISR of the LR step are right shifted, which provide 1 and 0 respectively to XOR 108. This produces a 1, which is shifted into the MSB of SISR 110 in Step 1 of Word 1 resulting in Shift Register 106 containing X010 and SISR containing 1000. The "X" in the MSB of Shift Register 106 indicates a "don't care" condition in that the contents of that bit location will not be used again, and therefore either a 0 or a 1 may be present with no change in the results.

This process is continued through steps 2, 3 and 4 of Word 1 resulting, in step 4, in Shift Register 106 containing xxxx, and in SISR 110 containing 0101. In Step LR, Word 2, 1010, is loaded from the ROM into Shift Register 106 but the previous results from Step 4 of Word 1 are retained in SISR 110, 0101. The process is then repeated four times for the four bits of Word 2 resulting in Step 4 in Shift Register 106 containing xxxx, and SISR containing 1111. As can be seen by inspection, changing the state of any bit in any ROM word or in the SISR 110 initial value will change the final SISR 1111 value.

Figure 3:
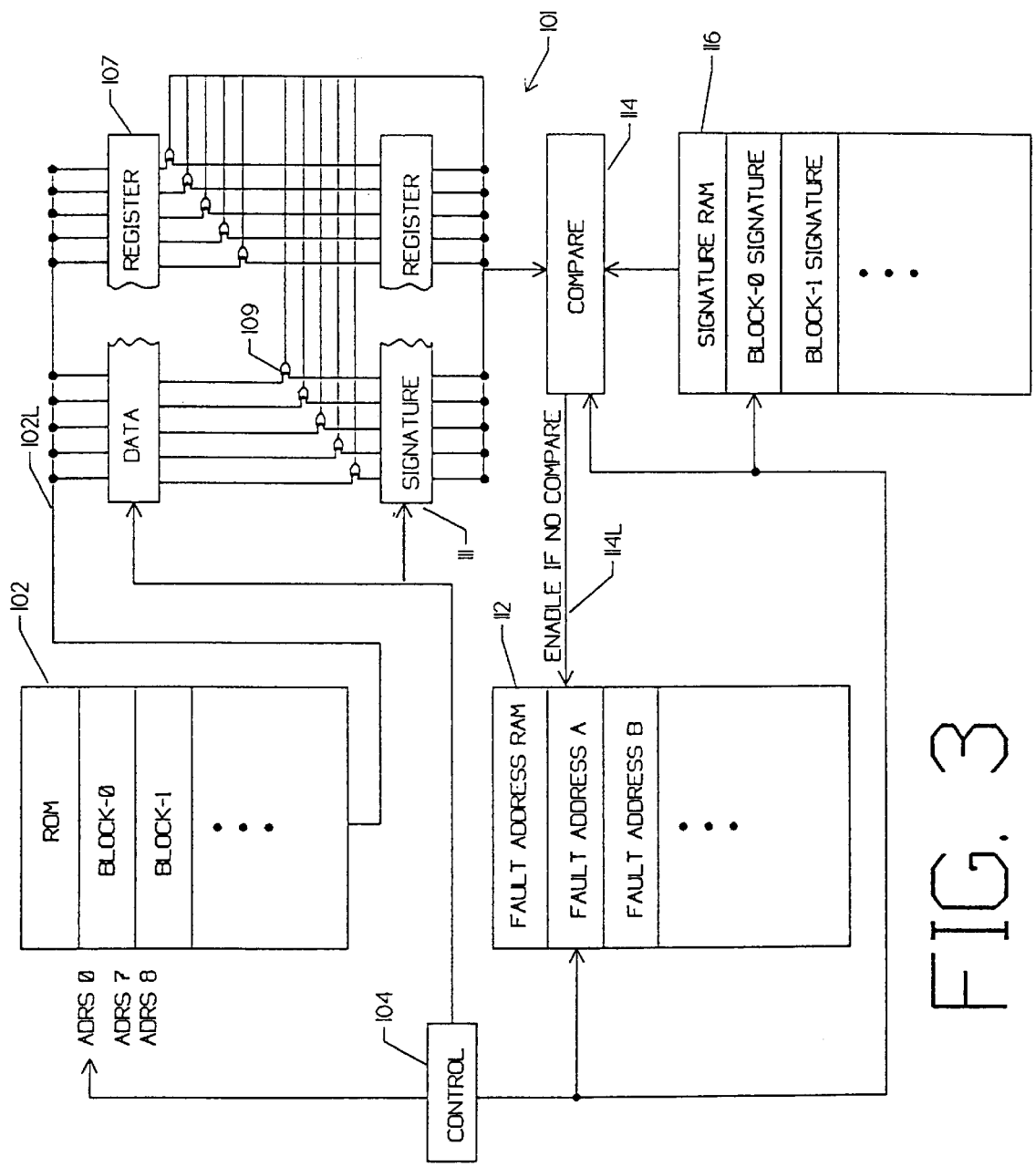
FIG. 3 is a block diagram of the second embodiment.

FIG. 3 shows the second embodiment, Fault Isolation Apparatus 101, which again includes Control 104, Fault Address RAM 112, Compare 114, Signature RAM 116 and ROM 102 having the same characteristics as before. This embodiment includes Data Register 107 and Signature Register 111, neither of which are shift registers. All of the registers and memories are again 240 bits in length. XOR 109 circuits are provided which are equal in number to the number of bits in a word.

Control 104 now contains a different program which provides the following described ROM fault test operation. Data Register 107 receives a data word from memory and Signature Register 111 receives a predetermined initial Signature value. Data Register 107 and Signature Register 111 have all of their bits non-carry added in parallel by 240 XOR 109 circuits with the results being returned to the Signature Register.

In operation, Control 104 calls up words sequentially from ROM 102 from Address 0 through Address 8 for Blocks 0 through 256, and loads each word in sequence into Data Register 107.

The address of the block under test is also stored in Fault Address Ram 112, which is overwritten by the next block address tested unless the "Enable If Unequal" line 114L is high. If line 114L is high that address is saved and the next ROM 102 address is placed in an adjacent higher RAM 112 address.

Control 104 also initially loads Signature Register 111 at the beginning of each block test. As before, this word can be all zeros or all ones and any known pattern will suffice. In this example, it is again assumed that Signature Register 111 is loaded with all zeros. As before, previous to a block test run Signature Register 116 is loaded with precalculated derived "Signature" words for all of the blocks of data under test and in the test order.

After Signature Register 111 is loaded with all zeros, the first word of the block under test is sent to Data Register 107 and that block address also sent to RAM 112 where it is are stored in sequence beginning with the Fault Address A location. Data Register 107 and Signature Register 111 are then added in parallel by XORs 109 and the results stored back in the Signature Register. Subsequent words from the data block under test of ROM 102 are then loaded in sequence into Data Register 107 with each also being added in parallel to Signature Register 111, and the results being stored back in the Signature Register until all eight words of the data block have been processed. After all eight words have been processed, a unique 240 bit Signature word in Signature Register 111 again represents that particular eight data word block and the initial Signature Register contents.

Figures 4A, 4B:
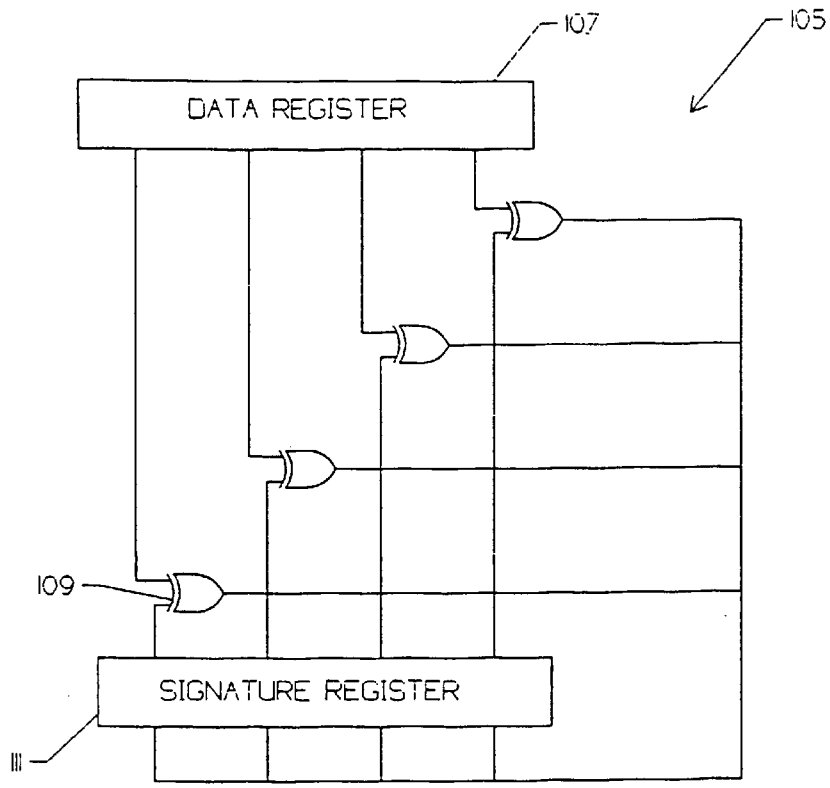
FIG. 4A is a simplified version of a portion of the second embodiment.
FIG. 4B is a table showing the results of operating the simplified portion of the second embodiment.

The above process for four bit words 105, shown in FIG. 4A, uses only elements XOR 109, Data Register 107 and Signature Register 111. A Table 120 of the results of this parallel process using four bit words and a two word block is shown in FIG. 4B. Here columns Word 122, Step 118, Data Register 107 and Signature Register 111 correspond to the headings in FIG. 2 with only the register names being changed. Opposite each Step 118 are shown the corresponding four bit contents respectively located below the headings of Data Register 107 and Signature Register 111.

The process begins with step Load Registers (LR) where Word 1, 0101, the first ROM word, is loaded into Data Register 107 and 0000 is loaded into Signature Register 111. Step 1 of Word 1 results when the bits of Data Register 107 and Signature Register 111 are added in parallel by XORs 109 and the results returned to the Signature Register which results in 0101 in the Signature Register. This concludes the process for word 1.

In Step LR, Word 2, 1100, is loaded from the ROM into Data Register 107 but the previous results from Step 1 of Word 1 is retained in Signature Register 111, namely, 0101. The above parallel process is repeated resulting in Signal Register 111 containing 1001. As can again be seen by inspection, changing the state of any bit in any ROM word or in Signature Register 111 initial value will change the final Signature Register value since the resulting time history of that bit location will be changed.

In the above examples, the word and block length were made short to minimize the amount of required explanation, however increasing the word length, or adding the number of words in a block, will not change the basic nature of the process. These simplified examples still illustrate that changing any bit in any word, or changing the initial Signature value, may change the final Signature value. This is true for any word length, any number of words in a block, any number of blocks, or any initial Signature value. This also illustrates why the final Signature value is unique to the particular words in a test block and the initial Signature value.

Prior to the test operation, the same process as that employed in the above embodiment is used to precalculate a derived or expected Signature for each of the same data blocks stored in the ROM using the same initial Signature value as was used in the test. These precalculated Signature values are stored in Signature RAM 116 in the same order as the equivalent ROM blocks will be tested. If no errors are detected, the derived and test Signatures should be identical. Note that any initial word can be used as the initial Signature value in the actual test as long as the same initial value is used in the calculation for the derived Signature word.

After processing a block of memory from ROM 102 and obtaining a test Signature, the derived Signature for the same block is obtained from Signature RAM 116, and all of the bits of the test and derived Signature are compared in Compare 114, a 240 bit comparator. Any difference between the test Signature and the derived Signature will indicate an error in the data in that block of ROM and will result in the "ENABLE IF NO COMPARE" line 114L being raised. This will enable and retain that ROM block address in Fault Address RAM 112. The first block tested to have an error will be retained in Fault Address RAM 112 in Fault Address A, the second block tested to have an error will be retained in Fault Address B, etc. This fault address process is repeated for each test block, where an error will cause the block address to be retained and no error will result in the next block address overwriting the previous address in Fault Address RAM 112.

The test process described above is repeated for each block of data in ROM 102 to test all of the words of memory in each block and compare the resulting test Signatures with their corresponding derived Signatures. After the tests have been completed for all of the blocks, Fault Address RAM 112 will contain the addresses of all data blocks of ROM 102, in order, that have failed the test.

The contents of Fault Address RAM 112 is available to the operating system which can use this data to correct for these failures in system operation. Since all of either Fault Isolation Apparatus 100 or Apparatus 101 may be resident on an ASIC, which also contains ROM 102, this test can be repeated at any time to locate subsequently failed ROM memory blocks. If more than one ROM is used in an ASIC, Signature RAM 116 is loaded with derived Signatures for all of the blocks of all of the ROMs to be tested in the order of the test sequence provided by Control 104. Alternatively, a separate signature RAM may be provided for each ROM.

While this test apparatus and method is directed to an ASIC, they can be applied to a board or any other system where it would be useful to test memory contents without using the processing system. This results because Fault Isolation Apparatus 100 or 101 for embodiments 1 or 2 respectively, are in addition to and operate independent of the computation process, and consequently can be interleaved with any computation or alternatively can use open computation time to obtain and test words from the ROM memories. Further, while an Exclusive-Or process has been used here, any other process either logic or numeric, which manipulates the bits in a memory block with an initial word and providing a unique Signature will provide similar results and advantages as described above.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method for fault testing a memory that is organized into a number of blocks of words, the method comprising the steps of:
    a) reading selected words from a selected block of memory;
    b) logically combining the selected words to produce a test signature;
    c) comparing the test signature with a predetermined expected signature; and
    d) marking the address of the selected block of memory if the test signature and the predetermined expected signature do not compare.

2. A method according to claim 1 further comprising the step of:
    a) avoiding the use of the selected block of memory that is marked by the marking step 1(d).

3. A method for fault testing a memory that is organized into a number of blocks of words, the method comprising the steps of:
    a) reading a first word from a selected block of memory;
    b) logically combining the first word with a predetermined initial signature value to produce a temporary signature value;
    c) reading a second word from the selected block of memory;
    d) logically combining the second word with the temporary signature value; and
    e) repeating steps (c)–(d) until all of the words in the selected block of memory have been processed, thereby providing a test signature.

4. A method according to claim 3 wherein the test signature is compared to a predetermined expected signature, wherein an error is reported if the test signature and the predetermined expected signature do not have a predetermined relationship therebetween.

5. A method according to claim 4 wherein the predetermined relationship is equality.

6. A method according to claim 4 further comprising the step of marking the address of the selected block of memory if an error is detected.

7. A method according to claim 6 further comprising the step of avoiding the use of the selected block of memory that is marked by the marking step.

8. Apparatus for fault testing a memory organized into a number of blocks of words, comprising:
    a) reading means for successively reading selected words from a selected block of memory;
    b) combining means coupled to said reading means for logically combining a first word read from the selected block of memory with a predetermined prestored word, thereby providing a result; and
    c) replacing means coupled to said combining means for replacing the prestored word with the result, thereby resulting in a first replacement word.

9. Apparatus according to claim 8 wherein said combining means further logically combines a second word that is read from the selected block with the first updated prestored word, thereby resulting in second replacement word, wherein the replacing means replaces the first replacement word with the second replacement word.

10. Apparatus according to claim 9 wherein said reading means reads the remaining words from the selected block, and said combining means logically combines the remaining words, one by one, with the replacement word generated by the previous word, and ultimately providing a test signature word.

11. Apparatus as in claim 10 and further comprising:
    a) first storage means for storing, in test order, a number of derived signature words;
    b) comparing means for comparing a selected derived signature word and the test signature word to determine if a predetermined relationship exists therebetween; and
    c) second storage means for storing the address of the block of data when the test signature word does not have the predetermined relationship with the derived signature word.

12. Apparatus as, in claim 8 with said comparing means being serial having a shift register which provides consecutive bits of the prestored word and subsequent replacement words to a logical element, and which receives bits from said logical element, and having a second shift register which provides consecutive bits of words read from the selected block of memory to said logical element.

13. Apparatus as in claim 12 wherein said logical element comprises an exclusive-or circuit.

14. Apparatus as in claim 8 wherein said comparing means is parallel having a first register which receives the prestored word and subsequent replacement words, and having a second register which receives consecutive words from the selected block of memory.

15. Apparatus as in claim 14 wherein said logical element comprises an exclusive-or circuit for each bit position.

* * * * *